(12) United States Patent
Ichikawa et al.

(10) Patent No.: US 11,910,504 B2
(45) Date of Patent: Feb. 20, 2024

(54) LIGHT SOURCE MODULE AND LIGHTING CIRCUIT

(71) Applicant: KOITO MANUFACTURING CO., LTD., Tokyo (JP)

(72) Inventors: Tomoyuki Ichikawa, Shizuoka (JP); Atsushi Ozawa, Shizuoka (JP); Mariko Miwa, Shizuoka (JP); Yutaka Matsumoto, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 17/905,802

(22) PCT Filed: Mar. 10, 2021

(86) PCT No.: PCT/JP2021/009422
§ 371 (c)(1),
(2) Date: Sep. 7, 2022

(87) PCT Pub. No.: WO2021/187260
PCT Pub. Date: Sep. 23, 2021

(65) Prior Publication Data
US 2023/0112753 A1    Apr. 13, 2023

(30) Foreign Application Priority Data

Mar. 18, 2020    (JP) .................... 2020-047976

(51) Int. Cl.
*H05B 45/54*    (2020.01)
*H05B 45/345*    (2020.01)
(Continued)

(52) U.S. Cl.
CPC .......... *H05B 45/54* (2020.01); *B60Q 11/005* (2013.01); *H05B 45/345* (2020.01); *B60Q 1/303* (2022.05); *B60Q 1/44* (2013.01); *F21V 29/763* (2015.01)

(58) Field of Classification Search
CPC . B60Q 3/258; B60Q 3/74; B60Q 3/64; B60Q 7/00; B60Q 1/2665; B60Q 3/82; B60Q 1/247; B60Q 1/323; B60Q 2500/00
See application file for complete search history.

(56) References Cited

U.S. PATENT DOCUMENTS

| | | | |
|---|---|---|---|
| 11,350,505 B2 | 5/2022 | Ichikawa et al. | |
| 2013/0342115 A1* | 12/2013 | Yang | H05B 45/00 315/185 R |

(Continued)

FOREIGN PATENT DOCUMENTS

| | | |
|---|---|---|
| JP | 2015-168305 A | 9/2015 |
| JP | 2016-197711 A | 11/2016 |

(Continued)

OTHER PUBLICATIONS

International Search Report dated May 11, 2021 filed in Patent Application PCT/JP2021/009422.
European Search Report dated Jun. 9, 2023 for the corresponding European Patent Application No. 21771555.6.

*Primary Examiner* — Wei (Victor) Y Chan
(74) *Attorney, Agent, or Firm* — Pearne & Gordon LLP (57) ABSTRACT

There is provided a rear sign lamp capable of enhancing safety. An LED string (502) includes four LEDs (504_1 to 504_4) connected in series. An LED driver circuit (610) receives a battery voltage ($V_{IN}$) and supplies a drive current ($I_{LED}$) stabilized at a target current ($I_{REF}$) to the LED string (502). A bypass circuit (620) is provided in parallel with a bypassed portion (503) including two adjacent LEDs (504_3

(Continued)

and 504_4) of the LED string (502), and sinks a bypass current ($I_{BYPASS}$) according to a battery voltage ($V_{IN}$).

9 Claims, 5 Drawing Sheets

(51) Int. Cl.
*B60Q 11/00* (2006.01)
*F21V 29/76* (2015.01)
*B60Q 1/30* (2006.01)
*B60Q 1/44* (2006.01)
*H05B 45/20* (2020.01)
*H05B 45/325* (2020.01)
*H05B 45/36* (2020.01)

(56) References Cited

U.S. PATENT DOCUMENTS

| | | | | |
|---|---|---|---|---|
| 2015/0163871 A1* | 6/2015 | Takeshi | ............... | H05B 45/48 |
| | | | | 315/82 |
| 2015/0173133 A1* | 6/2015 | Seki | ............... | H05B 45/54 |
| | | | | 315/185 R |
| 2017/0359869 A1* | 12/2017 | Ohta | ............... | B60Q 1/382 |
| 2018/0234011 A1* | 8/2018 | Muramatsu | ............... | H02M 3/073 |
| 2021/0168918 A1 | 6/2021 | Ichikawa et al. | | |

FOREIGN PATENT DOCUMENTS

| | | |
|---|---|---|
| JP | 2019-192478 A | 10/2019 |
| JP | 2020-013642 A | 1/2020 |
| WO | 2020/045271 A1 | 3/2020 |

* cited by examiner

FIG. 6 ively replaced.

LIGHT SOURCE MODULE AND LIGHTING CIRCUIT

TECHNICAL FIELD

The present invention relates to a lighting fixture used for a vehicle such as an automobile.

BACKGROUND ART

Conventionally, as a light source used for a vehicle lighting fixture, a light bulb has been often used. However, in recent years, a semiconductor light source such as a light-emitting diode (LED) has been widely adopted.

Figure 1:
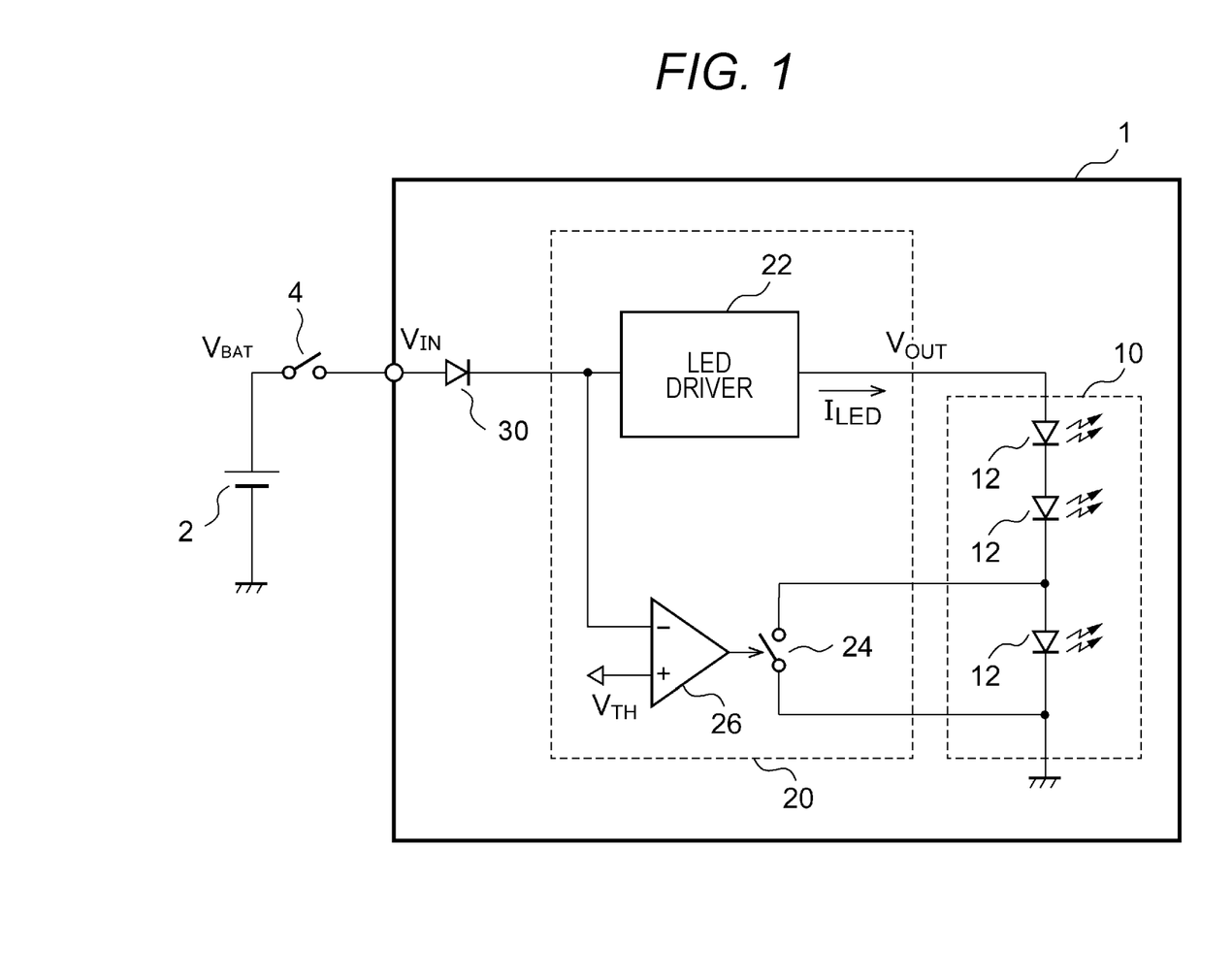
FIG. 1 is a block diagram of a conventional vehicle lighting fixture.

FIG. 1 is a block diagram of a conventional vehicle lighting fixture 1. The vehicle lighting fixture 1 receives a DC voltage (input voltage $V_{IN}$) from a battery 2 through a switch 4. An LED string (LED bar) 10 includes a plurality (n) of LEDs 12 connected in series. The luminance of the LED string 10 is controlled according to a drive current $I_{LED}$ carried through the LED string 10. A lighting circuit 20 includes an LED driver circuit 22 that stabilizes the drive current $I_{LED}$ to a target amount $I_{REF}$ according to a target luminance.

Supposing that a forward voltage when the drive current $I_{LED}$ stabilized at a target amount $I_{REF}$ is carried through the LED 12 is $Vf_0$, the voltage $V_{MIN}$ across both ends of the LED string 10 (referred to as a minimum lighting voltage) is $Vf_0 \times n$. When n=3, $V_{MIN} \approx 11$ V in a white LED. In other words, when an output voltage $V_{OUT}$ of the LED driver circuit 22 drops below the minimum lighting voltage $V_{MIN}$, the drive current LED fails to maintain the target amount $I_{REF}$, and the plurality of LEDs 12 is turned off.

In an LED socket sold as an alternative to a conventional automotive light bulb, since a cost reduction is demanded, the LED driver circuit 22 is formed of a constant current series regulator, a buck converter with constant current output, or a resistor. In this case, the output voltage $V_{OUT}$ of the LED driver circuit 22 is lower than the input voltage $V_{IN}$. Although the input voltage $V_{IN}$ is 13 V in a fully charged state of the battery, it is familiar that the input voltage $V_{IN}$ drops to 10 V or less as discharging progresses. Therefore, when a battery voltage $V_{BAT}$ drops (referred to as a low voltage state), a situation in which the output voltage $V_{OUT}$ drops below the minimum lighting voltage $V_{MIN}$ occurs, and the LED 12 is turned off.

In order to prevent the LED strings 10 from being turned off in the low voltage state, a bypass switch 24 and a bypass control circuit 26 are provided. The bypass switch 24 is connected in parallel with one LED 12_n on the lowest potential side. When the input voltage $V_{IN}$ becomes lower than a certain threshold value $V_{TH}$, the bypass control circuit 26 determines a low voltage state and turns on the bypass switch 24. In this state, the minimum lighting voltage $V_{MIN}=Vf_0 \times (n-1)$, and $V_{IN}>V_{MIN}$ is maintained. That is, in exchange for turning off the LED 12_n, the lighting of the remaining LEDs 12_1 to 12_(n-1) can be maintained.

CITATION LIST

Patent Literature

Patent Literature 1: JP-A-2016-197711

SUMMARY OF THE INVENTION

Problems to be Solved by the Invention

The present inventors have investigated the application of the lighting circuit 20 of FIG. 1 to a rear sign lamp such as a stop lamp, a tail lamp, and a rear fog lamp, and recognized the following problems. When the voltage drop of a red LED is 2.4 V and n=4, $V_{MIN}=2.4$ V$\times 4=9.6$ V. When the forward voltage of a reverse connection protection diode 30 is 0.8 V, the threshold voltage $V_{TH}$ is 9.6 V+0.8 V+α, and when a margin a is 1 V, $V_{TH}=11.4$ V. Therefore, when $V_{IN}>11.4$ V, the LED string 10 is normally lit.

In addition, when $V_{BAT}$ is less than 11.4 V, a current is carried through the bypass switch 24, and the LED 12_4 on the lowest potential side is bypassed. The minimum lighting voltage at this time is $V_{MIN}=1.8$ V$\times 3=5.4$ V. Therefore, the lighting of the LED string 10 can be maintained up to around $V_{BAT}=5.4$ V+0.8 V=6.2 V.

In recent years, vehicles having an idling stop function are increasing in order to improve fuel efficiency. The stop lamp has to be turned on during stopping of the vehicle, in other words, exactly for a period in which an idling stop occurs. During idling stop, since an alternator is stopped, when the load of the battery increases, a battery voltage drops significantly. For example, when an air conditioner operates or an engine restarts by operating a steering during idling stop, the load current of the battery 2 increases. As a result, when the battery voltage $V_{BAT}$ drops below the minimum lighting voltage $V_{MIN}=6.2$ V, the LED string 10 is turned off. When the stop lamp is turned off, a subsequent vehicle erroneously recognizes that a preceding vehicle has started.

The present invention has been made in view of such problems, and an exemplary object of an aspect of the present invention is to provide a rear sign lamp capable of improving safety.

Solution to the Problems

An aspect of the present invention relates to a light source module. A light source module includes an LED string including four LEDs (light-emitting diodes) connected in series, an LED driver circuit that receives a battery voltage and supplies a drive current stabilized at a target current to the LED string, and a bypass circuit that is provided in parallel with a bypassed portion including two adjacent LEDs of the LED string and sinks a bypass current according to the battery voltage.

Another aspect of the present invention relates to a lighting circuit that drives an LED string including four LEDs (light-emitting diodes) connected in series. A lighting circuit includes an LED driver circuit that receives a battery voltage and supplies a drive current stabilized at a target current to the LED string, and a bypass circuit that is provided in parallel with a bypassed portion including two adjacent LEDs of the LED string and sinks a bypass current according to the battery voltage.

It should be noted that aspects in which arbitrary combinations of the above components and components and expressions of the present invention are mutually replaced among methods, apparatuses, systems, and the like are also effective as aspects of the present invention

Effects of the Invention

According to an aspect of the present invention, it is possible to enhance safety.

BRIEF DESCRIPTION OF THE DRAWINGS

FIG. 4 shows: in (a), a diagram showing an example of input voltage dependency of a quantity of emitted light; and in (b), a diagram showing an example of input/output characteristics of a bypass circuit.

FIG. 5 shows, in (a) and (b), circuit diagrams showing a configuration example of a bypass circuit.

FIG. 6 shows, in (a) to (d), diagrams showing an LED socket that is an example of a vehicle lighting fixture.

DESCRIPTION OF THE EMBODIMENTS

Outline of Embodiment

An embodiment disclosed herein relates to a light source module. A light source module includes an LED string including four LEDs (light-emitting diodes) connected in series, an LED driver circuit that receives a battery voltage and supplies a drive current stabilized at a target current to the LED string, and a bypass circuit that is provided in parallel with a bypassed portion including two adjacent LEDs of the LED string and sinks a bypass current according to the battery voltage.

According to this configuration, since the two LEDs are bypassed when the battery voltage drops, even in the case in which a load on the battery increases during idling stop, it is possible to prevent the LED string from being turned off. Therefore, in the case in which this light source module is used for a rear sign lamp, it is possible to prevent the LED string from unintentionally turning off and from sending an erroneous message to the subsequent vehicle while the vehicle is stopped.

The light source module may further include a break detection circuit that disables the bypass circuit when a break of a bypassed portion is detected. When the current bypass is performed in a voltage-reduced state in the case in which the bypassed portion is broken, an undesirable situation occurs in which the LED string is turned on in the voltage-reduced state although the LED string is turned off in the normal battery voltage. Therefore, with the provision of the break detection circuit, when a break occurs, it is possible to turn off the LED string regardless of the voltage level of the battery voltage.

When the voltage drop in the bypassed portion exceeds Vf×2, the break detection circuit may determine that the bypassed portion is broken.

The slope of the bypass current to the battery voltage may be determined such that the slope of the quantities of light emitted from the four LEDs to changes in the battery voltage is 5%/0.1 V or less. As a result, it is difficult for a person to feel fluctuations in the quantity of emitted light due to short-term fluctuations in the battery voltage.

Embodiment

Hereinafter, the present invention will be described based on preferred embodiments with reference to the drawings. The same or equivalent components, members, and processes shown in the drawings are denoted with the same reference numerals, and redundant description will be omitted as appropriate. In addition, the embodiment does not limit the invention but is an example, and all features described in the embodiment and combinations of the features are not necessarily essential to the invention.

In the present DESCRIPTION, "a member A is in a state in which the member A is connected to a member B" includes not only the case in which the member A and the member B are physically and directly connected to each other but also the case in which the member A and the member B are indirectly connected to each other through another member, which does not substantially affect an electrical connection state between the member A and the member B or which does not impair a function or an effect exerted by coupling of the member A to the member B.

Similarly, "a member C is provided between the member A and the member B" includes not only the case in which the member A and the member C, or the member B and the member C are directly connected to each other but also the case in which the members are indirectly connected to each other through another member, which does not substantially affect an electrical connection state between the members or which does not impair a function or an effect exhibited by the connection between the members.

In addition, in the present DESCRIPTION, an electric signal such as a voltage signal or a current signal, or a sign attached to a circuit element such as a resistor or a capacitor represents a voltage value, a current value, a resistance value, or a capacitance value as necessary.

Figure 2:
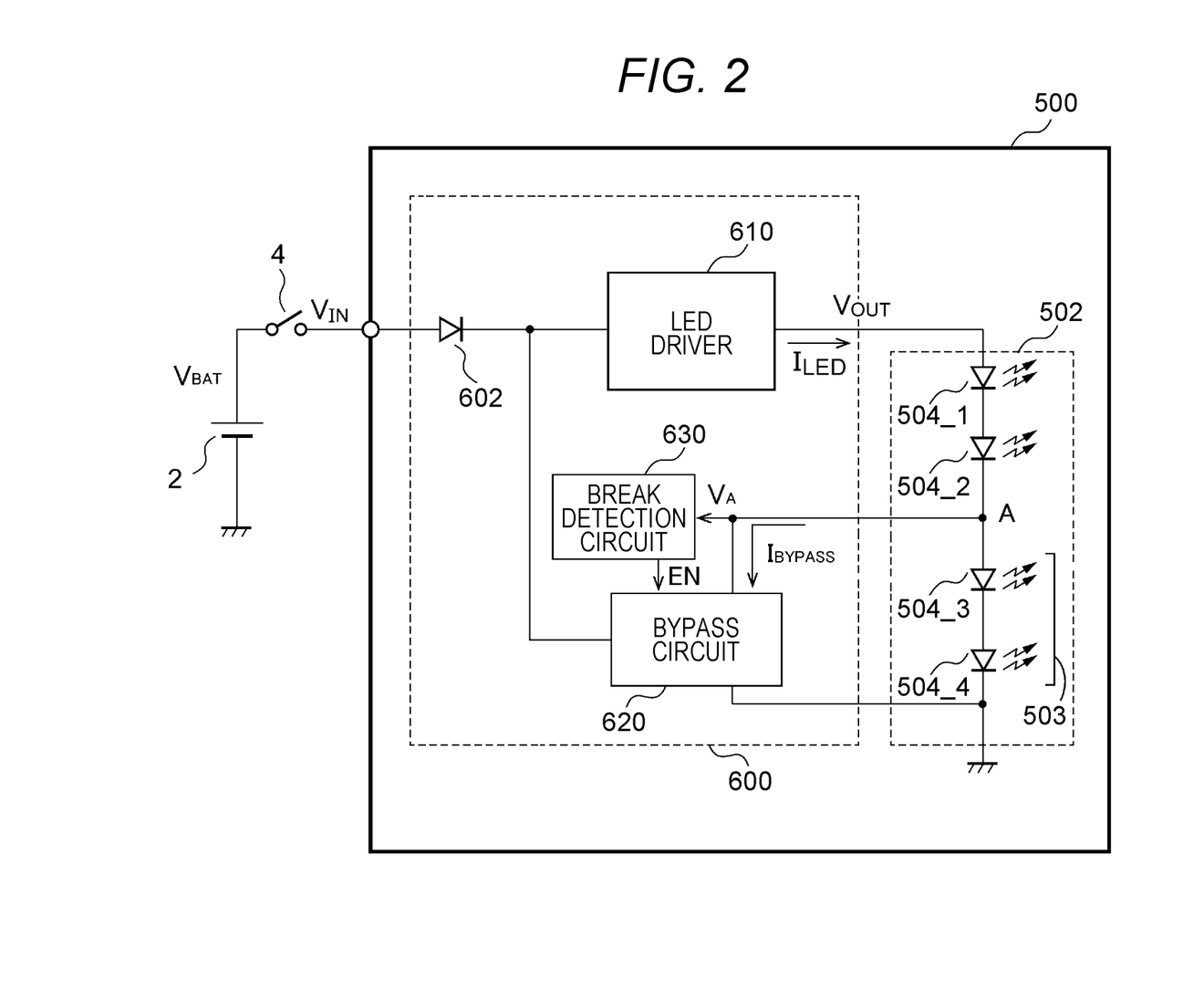
FIG. 2 is a block diagram of a vehicle lighting fixture including a lighting circuit according to an embodiment.

FIG. 2 is a block diagram of a vehicle lighting fixture 500 including a lighting circuit 600 according to the embodiment. To the vehicle lighting fixture 500, a DC voltage (input voltage) $V_{IN}$ from a battery 2 is supplied through a switch 4. The vehicle lighting fixture 500 includes an LED string 502 and the lighting circuit 600. The LED string 502 includes four LEDs 504_1 to 504_4 connected in series. The vehicle lighting fixture 500 is, for example, a rear sign lamp such as a stop lamp, a tail lamp, or a rear fog lamp, and the LED string 502 includes a red LED.

A preferred aspect of the vehicle lighting fixture 500 is a light source module in which the LED string 502 and the lighting circuit 600 are housed in one package. For example, the vehicle lighting fixture 500 is an LED socket having a shape attachable to and detachable from a lamp body (not shown), similarly to a conventional automotive bulb. Since the LED socket is a consumable, a cost reduction is strongly demanded as well as a long life.

The lighting circuit 600 includes a reverse connection protection diode 602, an LED driver circuit 610, a bypass circuit 620, and a break detection circuit 630.

The LED driver circuit 610 receives an input voltage $V_{IN}$ through the reverse connection protection diode 602 and supplies a drive current $I_{LED}$ stabilized at a target amount $I_{REF}$ to the LED string 502. The LED driver circuit 610 can be constituted of any of (i) a constant current linear regulator, (ii) a buck switching converter at a constant current output, (iii) a combination of a buck switching converter at a constant voltage output and a constant current circuit, and (iv) a resistor.

The bypass circuit 620 is connected in parallel with two (504_3 and 504_4) of the plurality of LEDs 504_1 to 504_4. The LEDs 504_3 and 504_4 are also referred to as bypassed portions 503. The bypass circuit 620 can switch between an enable state and a disable state, and in the enable state, the bypass circuit 620 sinks a bypass current $I_{BYPASS}$ corresponding to the input voltage $V_{IN}$ from the LED string 502. When the bypass current $I_{BYPASS}$ is carried, a current carried through the bypassed portion 503 becomes $I_{LED}-I_{BYPASS}$. When $I_{BYPASS}=0$, the bypassed portion 503 emits light with the same luminance as the remaining LEDs 504_1 and 504_2, whereas when $I_{BYPASS}=I_{LED}$, the bypassed portion 503 is turned off.

The break detection circuit 630 is formed capable of detecting a break of the bypassed portion 503. Upon detecting a break failure of the bypassed portion 503, the break detection circuit 630 disables the bypass circuit 620. In the bypass circuit 620 in the disabled state, the bypass current $I_{BYPASS}$ becomes zero, and sinking the current fails.

The method of detecting a break in the break detection circuit 630 is not specifically limited. However, for example, when the voltage drop of the bypassed portion 503, that is, a voltage $V_A$ of the node A exceeds a threshold voltage Vf×2, it may be determined that a break failure of the bypassed portion 503 occurs. Vf is the forward voltage of the LED string 502.

For example, the break detection circuit 630 may include a voltage comparator that compares the voltage of the node A with a threshold voltage $V_{OPEN}$. The threshold voltage $V_{OPEN}$ may be set slightly higher than Vf×2.

Figure 3:
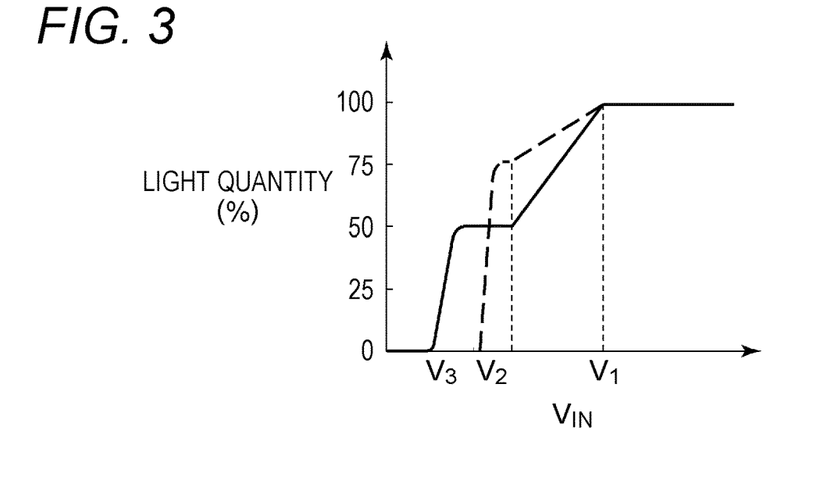
FIG. 3 is a diagram that describes an operation of a light source module.

FIG. 3 is a diagram that describes the operation of the vehicle lighting fixture 500. The horizontal axis represents the input voltage $V_{IN}$, and the vertical axis represents the light quantity (relative value) of the LED string 502. For comparison, an operation when one bypassed portion is provided as shown in FIG. 1 will be described.

In the case in which there is one bypassed portion, when the input voltage $V_{IN}$ drops below a certain voltage $V_1$, one LED of the four LEDs is bypassed by the bypass circuit, and thus the quantity of light drops toward 75%. When the input voltage $V_{IN}$ then drops below a certain voltage $V_2$ (e.g., 1.8 V×3+0.8 V=6.2 V), the quantity of light drops to zero.

On the other hand, according to the present embodiment, when the input voltage $V_{IN}$ becomes lower than the voltage $V_1$, the light quantity drops toward 50%. However, even though the input voltage $V_{IN}$ further drops, the light quantity is maintained at 50%. When the input voltage $V_{IN}$ further drops to a voltage $V_3$, the light quantity becomes 0%.

The above is the operation of the vehicle lighting fixture 500. According to the vehicle lighting fixture 500, when the battery voltage $V_{BAT}$ drops, the two LEDs 504_3 and 504_4 are bypassed, and thus even in the case in which a load on the battery increases during idling stop, it is possible to prevent the LED string 502 from being turned off. Therefore, in the case in which the vehicle lighting fixture 500 is used as a rear sign lamp, it is possible to prevent the LED string 502 from unintentionally turning off and from sending an erroneous message to the subsequent vehicle while the vehicle is stopped.

Next, the operation of the break detection circuit 630 will be described. In a state in which the normal battery voltage $V_{BAT}$ is supplied, $I_{BYPASS}$=0. At this time, when the bypassed portion 503 is broken, the current $I_{LED}$ is not carried through the LED string 502, and the LED string 502 is turned off. On the other hand, when the battery voltage $V_{BAT}$ (input voltage $V_{IN}$) drops while the bypassed portion 503 is broken, the bypassed portion 503, which is the broken portion, is bypassed by the bypass circuit 620, and the LED string 502 is lit, which is not preferable.

In the present embodiment, the break detection circuit 630 is provided, and when a break occurs, the bypass circuit 620 is disabled and $I_{BYPASS}$=0 is set, and thus it is possible to turn off the LED string regardless of the voltage level of battery voltage $V_{BAT}$ ($V_{IN}$).

When the slope of the bypass current $I_{BYPASS}$ to the fluctuation of the battery voltage $V_{BAT}$ is large, a slight fluctuation in the battery voltage $V_{BAT}$ appears as a large light quantity change. Therefore, the slope of the bypass current $I_{BYPASS}$ may be designed such that the slope of the quantities of light emitted from the four LEDs to the change in battery voltage is 5%/0.1 V or less. As a result, it is difficult for a person to feel fluctuations in the quantity of light due to short-term fluctuations in the battery voltage.

Figure 4:
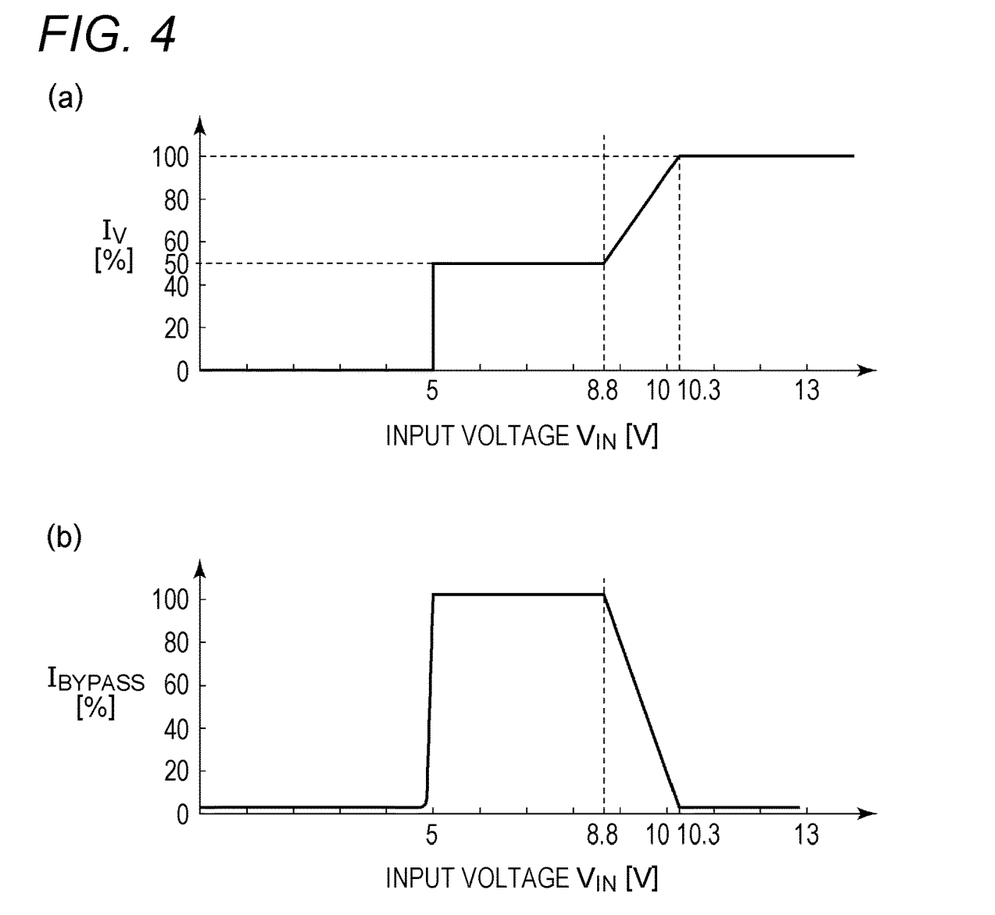

FIG. 4(a) is a diagram showing an example of input voltage dependency of the quantity of emitted light, and FIG. 4(b) is a diagram showing an example of input/output characteristics of the bypass circuit 620. In FIG. 4(a) and FIG. 4(b), the horizontal axis represents the input voltage $V_{IN}$, which is the input. In addition, the vertical axis in FIG. 4(a) indicates a value obtained by normalizing the emitted light quantities Iv of the four LEDs as the maximum light quantity is 100%. The vertical axis in FIG. 4(b) indicates a value obtained by normalizing the bypass current $I_{BYPASS}$ as the target amount $I_{REF}$ of the drive current $I_{LED}$ is 100%. In this example, when $V_{IN}$>10.3 V, $I_{BYPASS}$=0, and the emitted light quantity Iv is 100%. When $V_{IN}$<10.3 V, the bypass current $I_{BYPASS}$ rises, the current bypass starts, and the emitted light quantity Iv drops at a gradient of 5%/0.1 V or less. When the input voltage $V_{IN}$=8.8 V, $I_{BYPASS}$=100%, and the emitted light quantity Iv drops to 50%.

Figure 5:
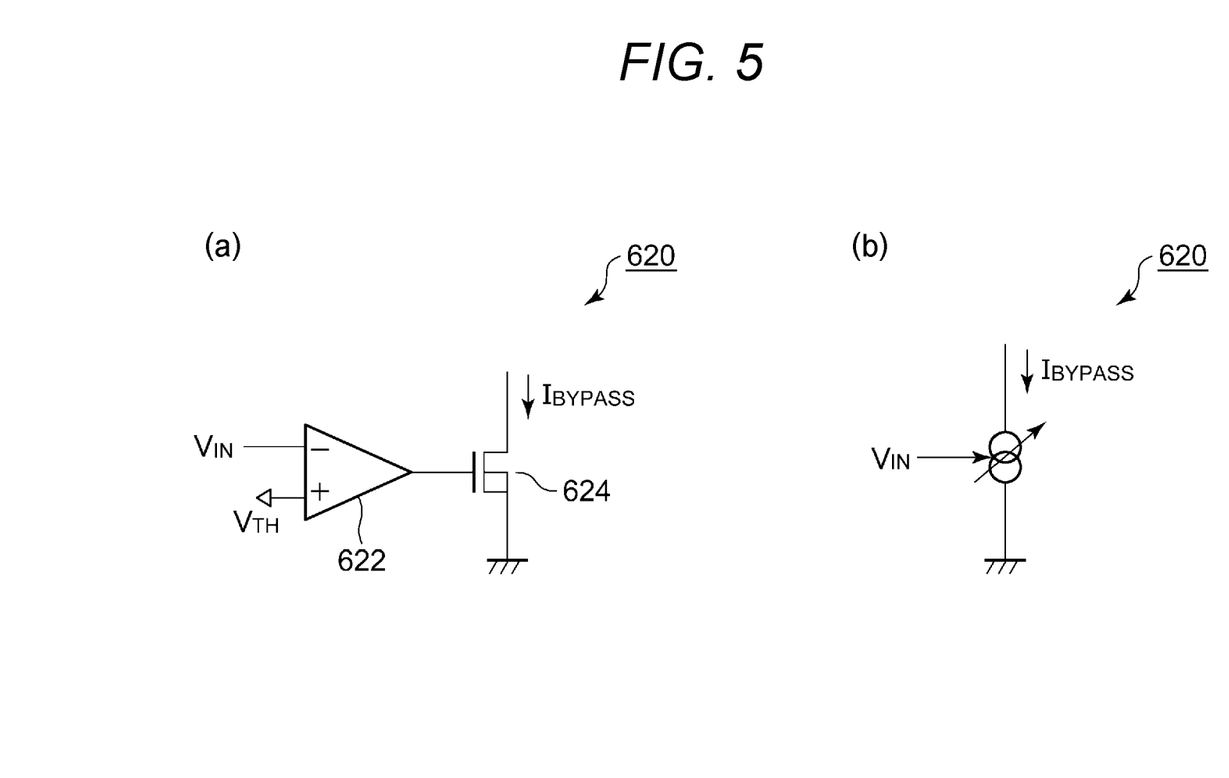

FIG. 5 shows, in (a) and (b), circuit diagrams showing a configuration example of the bypass circuit 620. The bypass circuit 620 of FIG. 5(a) includes a voltage comparator 622 and a transistor (switch) 624. The voltage comparator 622 compares the input voltage $V_{IN}$ with a threshold voltage $V_{TH}$, and turns on the transistor 624 when $V_{IN}$<$V_{TH}$. As the input voltage $V_{IN}$ drops, the gate voltage of the transistor 624 may gradually drops. The current carried through the transistor 624 becomes the bypass current $I_{BYPASS}$. Instead of the voltage comparator 622, an amplifier may be used. Instead of the voltage comparator 622, a pulse width modulator that generates a pulse width modulation (PWM) signal having a duty cycle corresponding to the input voltage $V_{IN}$ may be provided to drive the gate of the transistor 624 based on the PWM signal.

The bypass circuit 620 of FIG. 5(b) includes a variable current source 626. The variable current source 626 generates a bypass current $I_{BYPASS}$ of a current amount corresponding to the input voltage $V_{IN}$.

Figure 6:
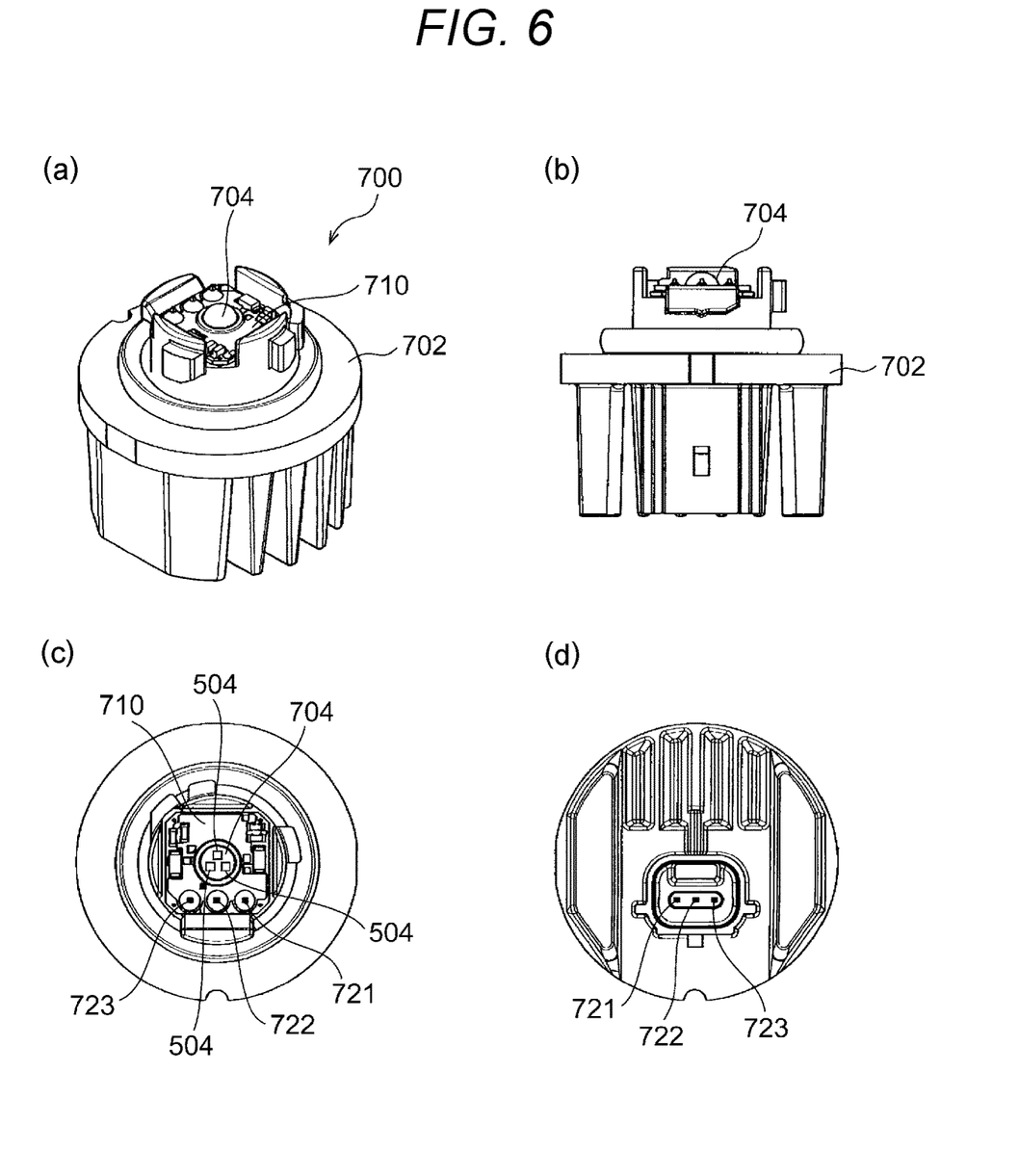

Next, the application of the vehicle lighting fixture 500 will be described. FIG. 6 shows, in (a) to (d), diagrams showing an LED socket that is an example of the vehicle lighting fixture 500. FIG. 6(a) is a perspective view of an external appearance of an LED socket 700. FIG. 6(b) is a front view showing the LED socket 700, FIG. 6(d) is a plan view showing the LED socket 700, and FIG. 6(c) is a bottom view showing the LED socket 700.

A housing 702 has a shape attachable to and detachable from a lamp body (not shown). In the center part, a plurality of LEDs 504 is mounted, and the LEDs 504 are covered with a transparent sealing resin 704. The components of the lighting circuit 600 are mounted on a substrate 710. The plurality of LEDs 504 is red LED chips and is used as stop lamps.

In the LED socket serving as both the stop lamp and the tail lamp, a light-emitting element for the tail lamp is mounted adjacent to the plurality of LEDs 504, and a lighting circuit for the tail lamp is mounted on the substrate 710.

On the bottom surface side of the housing 702, three pins 721, 722, and 723 are exposed. The input voltage $V_{IN}$ is supplied to the pin 721 through the switch, and the ground voltage is supplied to the pin 722. The pin 723 is supplied with an input voltage that becomes high when the tail lamp is turned on. The pins 721 to 723 penetrate through the inside of the housing 702, and one ends of the pins 721 to 723 are connected to the wiring pattern of the substrate 710.

Although the present invention has been described using specific phrases based on the embodiments, the embodiments merely show the principle and application of the present invention, and many modifications and changes in arrangement are appreciated in the embodiments without departing from the idea of the present invention defined in the claims.

The present international application claims priority based on Japanese Patent Application No. 2020-047976 filed on Mar. 18, 2020, and the entire contents of Japanese Patent Application No. 2020-047976, which is Japanese Patent Application of the present international application, are incorporated herein by reference.

The above description of the specific embodiments of the present invention has been presented for the purpose of illustration. The embodiments are not intended to be exhaustive or to limit the invention as it is in the form described. It is obvious to those skilled in the art that many modifications and alterations are possible in light of the above description.

LIST OF REFERENCE NUMERALS

500 Vehicle lighting fixture
502 LED string
503 Bypassed portion
504 LED
600 Lighting circuit
602 Diode
610 LED driver circuit
620 Bypass circuit
630 Break detection circuit

What is claimed is:

1. A light source module comprising: an LED string including four LEDs (light-emitting diodes) connected in series; an LED driver circuit that receives a battery voltage and supplies a drive current stabilized at a target current to the LED string; a bypass circuit that is provided in parallel with a bypassed portion including two adjacent LEDs of the LED string and sinks a bypass current according to the battery voltage, and a break detection circuit that disables the bypass circuit when a break of the bypassed portion is detected, wherein when the battery voltage drops below a predetermined voltage, the bypass circuit sinks the bypass current, the bypass circuit comprises a first voltage comparator and a transistor, the first voltage comparator turning on the transistor based on a comparison of the battery voltage and a first threshold voltage, and the break detection circuit comprises a second voltage comparator that detects the break of the bypass portion based on a comparison of a voltage of the bypass portion and a second threshold voltage.

2. The light source module according to claim 1, wherein when a voltage drop in the bypassed portion exceeds the second threshold voltage, $Vf \times 2$, the break detection circuit determines that the bypassed portion is broken.

3. The light source module according to claim 1, wherein a slope of light quantities of the two LEDs included in the bypassed portion to a change in the battery voltage is 5%/0.1 V or less.

4. The light source module according to claim 1, wherein the light source module is an LED socket.

5. The light source module according to claim 1, further comprising a reverse connection protection diode provided between an input terminal of the LED driver circuit and a battery.

6. A lighting circuit that drives an LED string including four LEDs (light-emitting diodes) connected in series, the lighting circuit comprising: an LED driver circuit that receives a battery voltage and supplies a drive current stabilized at a target current to the LED string; a bypass circuit that is provided in parallel with a bypassed portion including two adjacent LEDs of the LED string and sinks a bypass current according to the battery voltage, and a break detection circuit that disables the bypass circuit when a break of the bypassed portion is detected, wherein when the battery voltage drops below a predetermined voltage, the bypass circuit sinks the bypass current, the bypass circuit comprises a first voltage comparator and a transistor, the first voltage comparator turning on the transistor based on a comparison of the battery voltage and a first threshold voltage, and the break detection circuit comprises a second voltage comparator that detects the break of the bypass portion based on a comparison of a voltage of the bypass portion and a second threshold voltage.

7. The lighting circuit according to claim 6, wherein when a voltage drop in the bypassed portion exceeds the second threshold voltage, $Vf \times 2$, the break detection circuit determines that the bypassed portion is broken.

8. The lighting circuit according to claim 6, wherein a slope of a current at which the bypass circuit sinks to a change in the battery voltage is 5%/0.1 V or less when the target current is 100%.

9. The lighting circuit according to claim 6, further comprising a reverse connection protection diode provided between an input terminal of the LED driver circuit and a battery.

* * * * *